United States Patent [19]
Godshalk et al.

[11] Patent Number: 5,561,984
[45] Date of Patent: Oct. 8, 1996

[54] APPLICATION OF MICROMECHANICAL MACHINING TO COOLING OF INTEGRATED CIRCUITS

[75] Inventors: Kimberly M. Godshalk; Bruce Murdock, both of Beaverton, Oreg.

[73] Assignee: Tektronix, Inc., Wilsonville, Oreg.

[21] Appl. No.: 227,761

[22] Filed: Apr. 14, 1994

[51] Int. Cl.$^6$ ............................... F25B 19/00; F25D 3/12
[52] U.S. Cl. ................................. 62/51.1; 62/383
[58] Field of Search ........................... 62/51.1, 467, 383, 62/259.2, 6; 361/688, 699, 702, 704, 711; 29/890.035

[56] References Cited

U.S. PATENT DOCUMENTS

| | | | |
|---|---|---|---|
| 3,225,820 | 12/1965 | Riordan | 62/383 |
| 3,302,703 | 2/1967 | Kelly | 62/383 |
| 3,896,658 | 7/1975 | Hahn | 62/383 X |
| 4,212,346 | 7/1980 | Boyd | 62/383 X |
| 4,392,362 | 7/1983 | Little | 62/51.1 |
| 4,408,464 | 10/1983 | Salour et al. | 62/51.1 |
| 4,489,553 | 12/1984 | Wheatley et al. | |
| 4,768,352 | 9/1988 | Maruyama | 62/383 |
| 4,953,366 | 9/1990 | Swift et al. | 62/467 |

FOREIGN PATENT DOCUMENTS

| 2139745 | 11/1984 | United Kingdom | 62/259.2 |
|---|---|---|---|

OTHER PUBLICATIONS

G. W. Swift, *Thermoacoustic Engines*, Oct. 1988, pp. 1145–1150, United States.

John C. Wheatley, Gregory W. Swift, and Albert Migliori, *The Natural Heat Engine*, Fall 1986, pp. 9–13 and 20–27, United States.

*Primary Examiner*—Christopher Kilner
*Attorney, Agent, or Firm*—John Smith-Hill

[57] ABSTRACT

A thermodynamic engine comprises first and second heat exchange members and a solid state thermodynamic member therebetween. At least one of the heat exchange members is formed by use of micromechanical machining.

7 Claims, 5 Drawing Sheets

APPLICATION OF MICROMECHANICAL MACHINING TO COOLING OF INTEGRATED CIRCUITS

BACKGROUND OF THE INVENTION

This invention relates to the application of micromechanical machining to cooling of integrated circuits.

Certain integrated circuits operate at subambient temperatures. For example, cryoelectronic integrated circuits, such as Josephson junction (JJ) circuits, operate at cryogenic temperatures, i.e. temperatures below about 100K.

It is desirable to avoid thermally stressing an integrated circuit that is designed to operate at subambient temperatures, and this implies that the circuit structure should be maintained at subambient temperature throughout its working life. A typical integrated circuit is expected to operate for at least two years, and consequently a cooling device that is used to maintain a cryoelectronic integrated circuit at a cryogenic temperature must remain in service for at least two years without failing. The design and manufacture of a cooling device that will operate for such an extended period of time is attended by severe practical difficulties. For example, many conventional cooling devices operate by successively compressing and expanding a gaseous refrigerant. Typically, the refrigerant is compressed by use of a motor-driven pump and is then allowed to expand through an orifice. Such cooling devices have parts that move relative to each other in sliding contact, and these sliding parts are not well suited to continuous use for long periods of time.

A further requirement with respect to cooling of cryoelectronic integrated circuits relates to the size of the cooling device. It is desirable that the cooling device and the cryoelectronic integrated circuit be integrated as a single unitary structure, and that this structure not be significantly more bulky than the package of a conventional multichip module, which may be, for example, 8 cm$^3$ in volume.

G. W. Swift, *Thermoacoustic Engines*, J. Acoust. Soc. Am., Vol. 84 (No. 4) pg. 1145 (October 1988), the disclosure of which is hereby incorporated by reference herein, describes a thermoacoustic refrigerator having no moving parts. The thermoacoustic refrigerator comprises a prime mover (or thermoacoustic driver) that produces acoustic work in response to a temperature gradient and a heat pump that is driven by the acoustic work produced by the prime mover. The two thermoacoustic engines (the prime mover and the heat pump), which operate based on similar principles, each comprise a wall that bounds a cylindrical cavity for supporting an acoustic standing wave, and two heat exchangers intermediate the ends of the cavity. The prime mover has a hot heat exchanger, which receives heat from an external source, and a room temperature heat exchanger, whereas the heat pump has a cold heat exchanger, which absorbs heat, and a room temperature heat exchanger. When heat is applied to the hot heat exchanger of the prime mover, heat is absorbed by the cold heat exchanger of the heat pump and is rejected by the room temperature heat exchangers.

Each engine employs two thermodynamic media, one of which is a working fluid inside the cavity. The second thermodynamic medium is a stack of plates between the heat exchangers, the plates being spaced apart by a distance related to the thermal penetration depth in the fluid. The plates are made of a material having poor thermal conductivity, typically stainless steel, so that when one heat exchanger is hot and the other heat exchanger is cold, a temperature gradient exists along the plates. The room temperature heat exchangers are typically made of copper plates, the copper plates being 0.4 mm thick and at a spacing of 2.0 mm between plates for an operating frequency of 400 Hz. The hot heat exchanger of the prime mover may be made of nickel plates, and the cold heat exchanger of the heat pump may be made of copper plates.

The thermoacoustic refrigerator described by Swift is not suitable for cooling a cryoelectronic integrated circuit, because it is much too large to incorporate in a standard package for an integrated circuit. Further, for a thermoacoustic refrigerator that is sufficiently small to incorporate in an integrated circuit package, for example about 5 mm long, the stainless steel plates that form the second thermodynamic medium would need to be at a spacing of about 0.04 mm, and it has not been demonstrated that a suitable stack of stainless steel plates can be manufactured with any degree of consistency. Moreover, fabrication of suitable heat exchangers for a very small thermoacoustic refrigerator presents substantial difficulties.

The entropy of a body of material is lower when the body is cold than when it is hot. Thus, if a body of magnetic material in which the spins are randomly oriented is placed in a magnetic field such that the spins become aligned, its entropy is reduced and so also is its temperature. If the body of magnetic material is then placed in thermally conductive contact with an integrated circuit, heat flows from the integrated circuit to the body of magnetic material. Therefore, if the thermally conductive contact between the circuit and the body of magnetic material is accomplished by use of a thermal switch, i.e. a switch that selectively conducts heat, and the switch is operated synchronously with change in the magnetic field, the body of magnetic material can be used to cool the integrated circuit. The body of magnetic material then serves as a solid state cryogen.

A known superconductive material has a low thermal conductivityi when it is below the transition temperature and is in the superconductive state and a high thermal conductivity when it is below the transition temperature and is in the normally conductive (i.e. non-superconductive) state, and can be switched between the superconductive state and the normally conductive state by change in magnetic field. Thus, a wire of superconductive material can be used as a thermal switch that has no moving parts. However, this effect is of limited utility because separate means must be employed for cooling the wire to below the transition temperature.

Micromechanical machining is a technique whereby mechanical parts are formed using processes, such as photolithography and etching, that were developed and refined for use in manufacture of integrated circuits. Micromechanical machining allows fine control of dimensions and is commonly employed for production of mechanical parts from silicon. Micromechanical machining is not restricted in its application to forming of workpieces of silicon or other materials that are conventionally used in manufacture of integrated circuits, and it is known to apply micromechanical machining to other materials. Moreover, micromechanical machining can be used to form a mold in a body of silicon, for example, and another material that is not a suitable subject for photolithography or etching can be fabricated by reverse casting using the mold.

A typical cryogenic regenerator for an orifice pulse tube refrigerator (OPTR) operating at 400 Hz employs spheres of metal as a thermodynamic medium. The dimensions of the spheres depend upon the operating temperature, operating frequency, and the material of the spheres.

SUMMARY OF THE INVENTION

In accordance with a first aspect of the invention, an electronic structure comprises a cryoelectronic integrated circuit and a cooling device formed by use of micromechanical machining.

In accordance with a second aspect of the invention, a thermodynamic engine comprises first and second heat exchange members and a solid state thermodynamic member therebetween, at least one of said members having been formed by use of micromechanical machining.

In accordance with a third aspect of the invention, a thermal switch for selectively establishing a thermally conductive path between a cryogen and a body that is to be cooled comprises a body of material formed by micromechanical machining to have a major portion and a cantilever beam projecting therefrom, said major portion being adapted to be placed in thermally conductive contact with the cryogen, and means for selectively deflecting the beam into thermally conductive contact with the body that is to be cooled.

In accordance with a fourth aspect of the invention, an integrated circuit structure comprises an integrated circuit that is operable at a cryogenic temperature, a cryogen, and a thermal switch for selectively establishing a thermally conductive path between the cryogen and the integrated circuit, the thermal switch comprising a body of micromechanically machinable material, said body having a major portion that is in thermally conductive contact with the cryogen and a cantilever beam projecting therefrom and having a distal end spaced from said major position, and means for selectively deflecting the cantilever beam between a first condition in which its distal end contacts the integrated circuit and a second condition in which the distal end is spaced from the integrated circuit.

BRIEF DESCRIPTION OF THE DRAWINGS

For a better understanding of the invention, and to show how the same may be carried into effect, reference will now be made, by way of example, to the accompanying drawings in which.

DETAILED DESCRIPTION

Figure 1A:
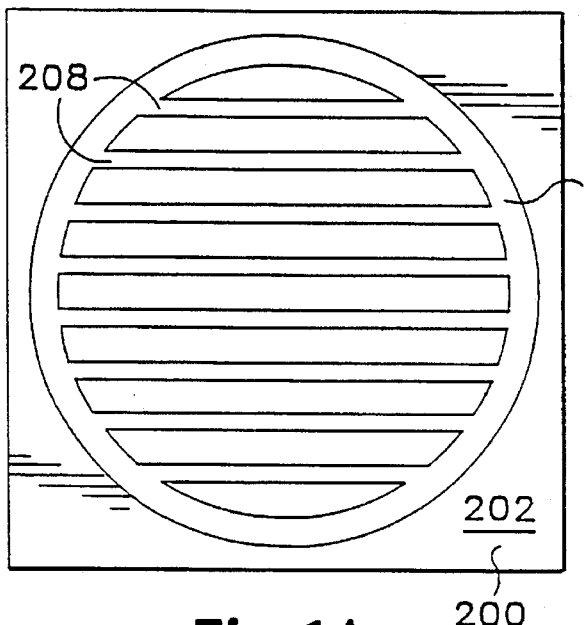
FIGS. 1A–1D illustrate fabrication of a heat exchanger by micromechanical machining, FIG. 1A being a plan view and FIGS. 1B, 1C and 1D being sectional views.
Figure 1B:
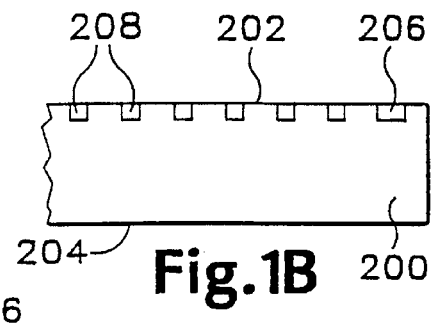

FIGS. 1A and 1B show a die 200 of monocrystalline silicon having a front surface 202 and a back surface 204. The die is selectively etched at its front surface to form an annular channel 206 having an external diameter of about 2.5 cm or about 5 cm and an array of linear channels 208 extending as parallel chords relative to the annular channel. The channels 208 are typically about 0.05 mm wide and at a spacing of about 1.8 mm.

Although each of the channels 206 and 208 is shown in FIG. 1B as having a depth substantially equal to its width and as having its sides perpendicular to the front surface 202, it will be appreciated that when a channel is etched in a silicon wafer, the sides would in fact be inclined at an angle of approximately 50° to the front surface. It will also be appreciated that this imposes a limit on the depth of the channel of about 1.2 times the width of the channel. Accordingly, the channels 208 are about 0.06 mm deep.

Figure 1C:
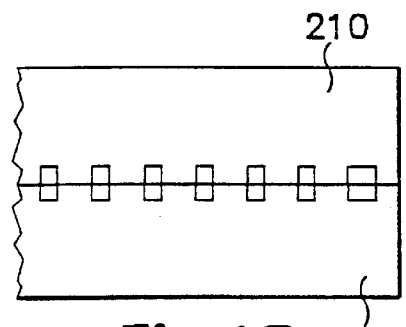

A second die 210 (FIG. 1C) is processed in similar fashion, and the two dies are positioned with their front surfaces in contact and the annular channels coaxial and with the two sets of linear channels, defined by the two dies respectively, in parallel relationship. The assembly of the two dies is then used as a mold for investment (or reverse) casting of a thermally conductive metal, such as nickel. Thus, molten nickel is cast into the channels, and after solidification of the nickel the silicon is dissolved, leaving an array of parallel plates 212 within a segment of tube 214 (FIG. 1D).

Figure 1D:
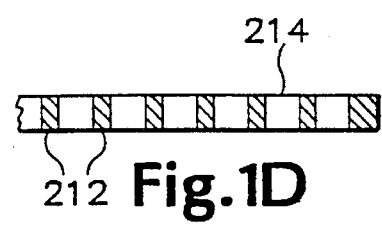

In the structure shown in FIG. 1D the length of the plates 212 in the axial direction of the tube 214 is about 0.12 mm. About forty such structures are bonded together to produce a device comprising an array of parallel plates in which the length of the plates in the axial direction is about 5 mm.

An alternative technique for forming the structure shown in FIG. 1D would be to deposit a layer of metal on the bottom surfaces of the channels 206 and 208 by evaporation, position the two dies with their front surfaces in contact, as explained above, and then plate nickel or other suitable metal into the die cavity.

An alternative approach is to form the channels 208 in thinner dies, so that the channels are open at the bottom of the die, and bond multiple dies together to form channels that are 5 mm deep and use the resulting assembly as a mold for investment casting.

Figure 2A:
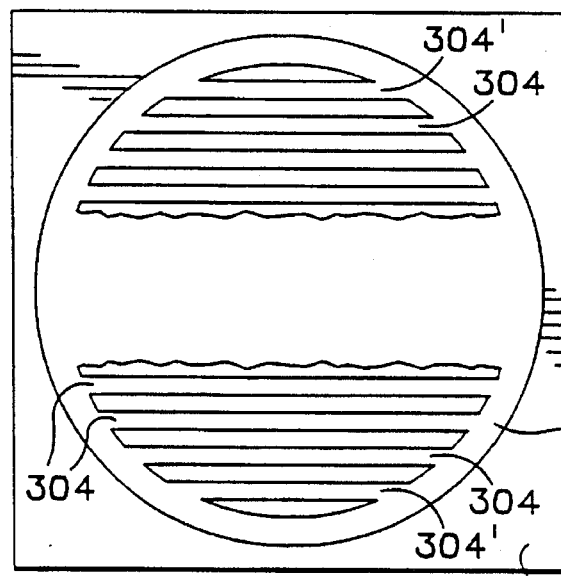
FIGS. 2A–2C illustrate fabrication of thermodynamic members by micromechanical machining, FIG. 2A being a plan view and FIG. 2B being a sectional view of a first thermodynamic member and FIG. 2C being a sectional view of a mold for forming a second thermodynamic member.

FIG. 2A illustrates the front surface of another silicon die 300 and illustrates a pattern on the front surface of the die. The pattern is composed of a ring 302 and linear strips 304 extending as parallel chords across the ring. The die 300 is etched so as to remove the material surrounding the ring 302, the material between the inner periphery of the ring and the two outer strips 304' and the material between each two other adjacent linear strips. In this fashion, a thermodynamic member 310 (FIG. 2B) made of silicon and comprising an annular support 312 and an array of narrow strips 314 that extend as parallel chords across the interior of the support and are spaced from each other. Using conventional micromechanical machining techniques, strips 314 at a spacing of 5 µm can be produced consistently.

Figure 2B:
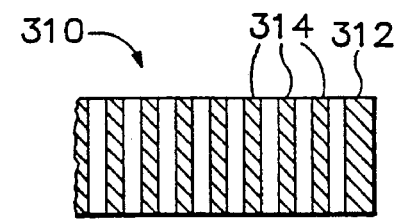
Figure 3:
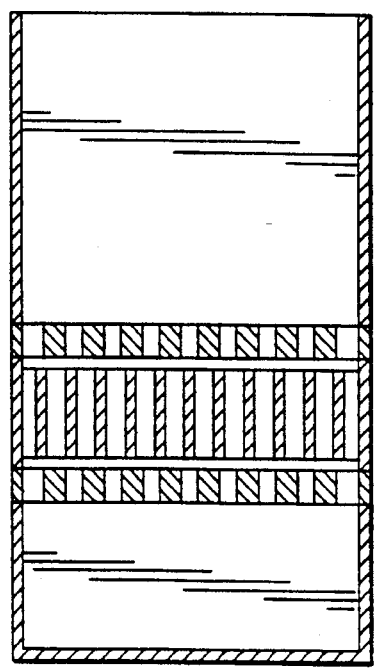
FIG. 3 is a sectional view of a thermoacoustic driver comprising heat exchangers made by the method described with reference to FIGS. 1A–1D and a thermodynamic member made by the method described with reference to FIGS. 2A and 2B, FIGS. 4A–4I illustrate various steps in fabrication of a thermal switch by micromachining of a silicon die, FIGS. 4A, 4B, 4D and 4E being sectional views, FIG. 4C being a plan view and FIGS. 4H and 4I being perspective views.

As shown in FIG. 3, a thermoacoustic engine of the kind described by Swift may be assembled using two parallel plate devices 330 made by the method described with reference to FIG. 1D as the heat exchangers and the thermodynamic member 310 shown in FIG. 2B as the second thermodynamic medium. Two such thermoacoustic engines, one acting as a prime mover and the other as a heat pump (in particular, an orifice pulse tube refrigerator), may be used to provide a thermoacoustic refrigerator capable of depressing the temperature of the cold heat exchanger of the refrigerator to a cryogenic temperature. The hot heat exchanger of the prime mover may be heated by use of a resistance wire in thermally conductive contact with the tube portion of the hot heat exchanger, and the cold heat exchanger of the prime mover and the hot heat exchanger of the heat pump are placed in thermally conductive contact with a heat sink at room temperature. The cold heat exchanger of the heat pump is in thermally conductive contact with a cryoelectronic integrated circuit chip.

Figure 2C:
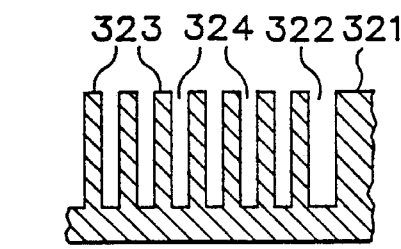

In a thermoacoustic engine of the kind described by Swift, the second thermodynamic medium must be of low thermal conductivity. Since the thermal conductivity of silicon becomes quite high at low temperatures, a thermodynamic member as shown in FIG. 2B is not optimum for use in the heat pump of the thermoacoustic refrigerator. However, a suitable device may be fabricated by investment casting of a material having a low conductivity at cryogenic temperatures, such as an alloy of Pb, Sn and In. The mold may be fabricated as the inverse of the thermodynamic member shown in FIG. 2B, with the strips 314 and the support 312 being connected together at the bottom. It will be appreciated that in the case of FIG. 2B, the linear strips are connected together by the annular support, and that in a true inverse of this device the strips would be unconnected. To ensure that the parts of the mold remain connected, the parts extend upwardly from a base structure. As shown in FIG. 2C, the mold 320 comprises a base having a cylinder member 321 extending upwardly therefrom, and parallel strips 323 extending upwardly from the base. Between the outer portion 321 and the strips 323 there is an annular space 322, corresponding to the ring-shaped support 312 of FIG. 2B, and between each two strips 323 is a space 324, corresponding to one of the strips 314. Alternatively, the thermodynamic member may be fabricated from $Er_3Ni$ or Nd using the technique known as LIGA, from the German acronym for lithography, electroforming and plastic molding.

Figure 4A:
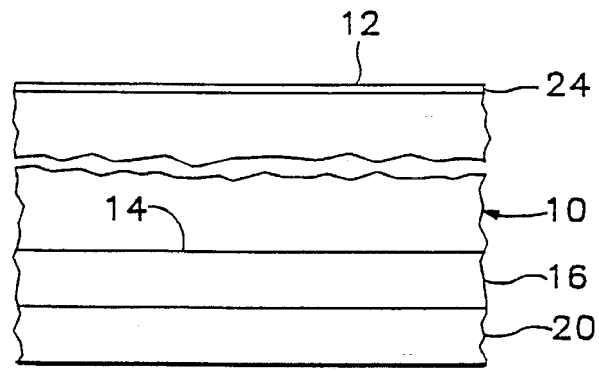
Figure 4B:
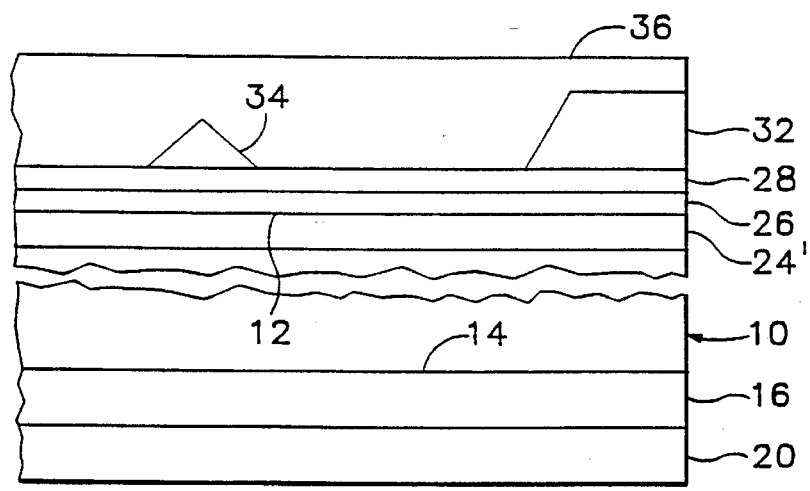
Figure 4C:
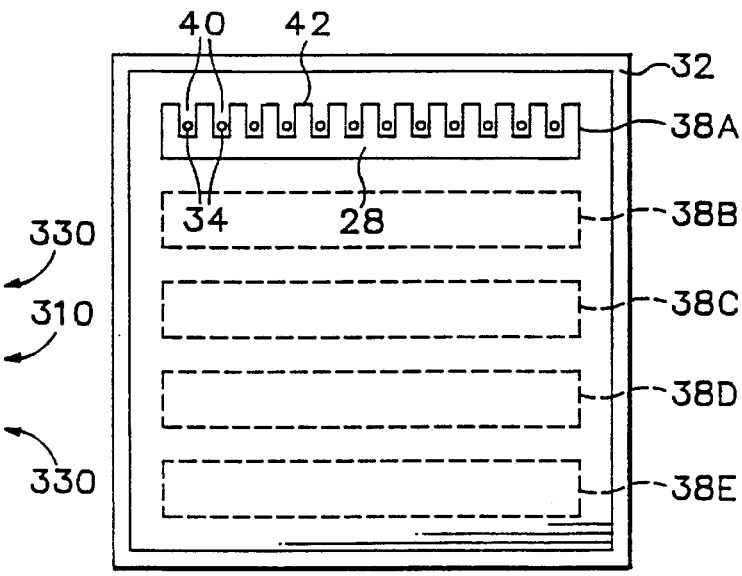
Figure 4D:
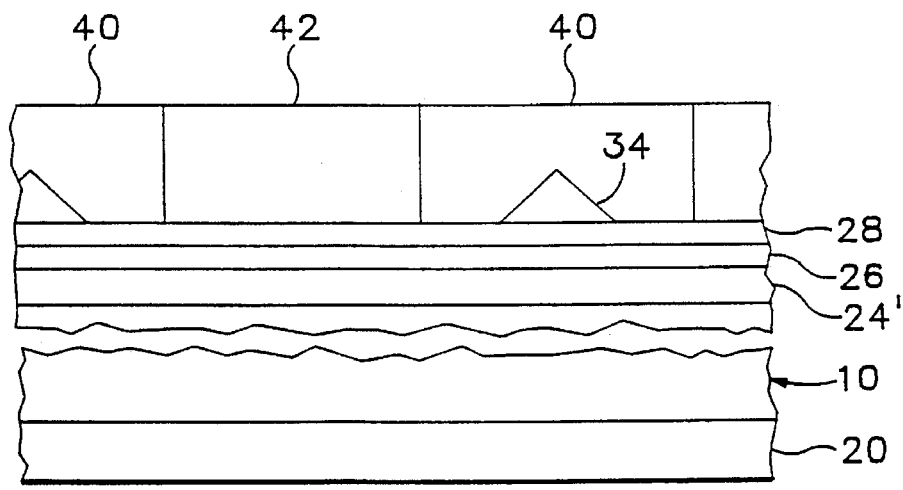
Figure 4E:
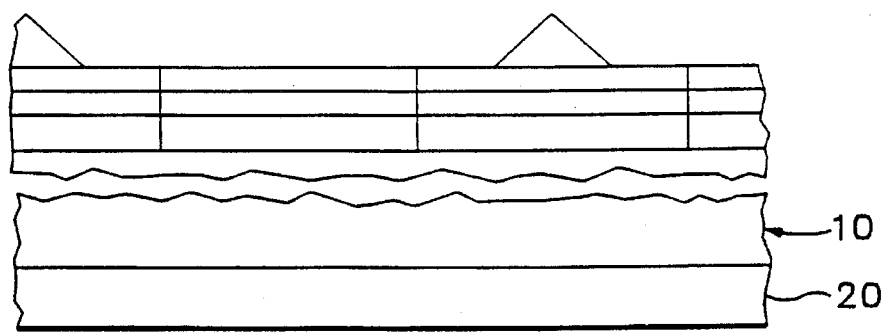
Figure 4F:
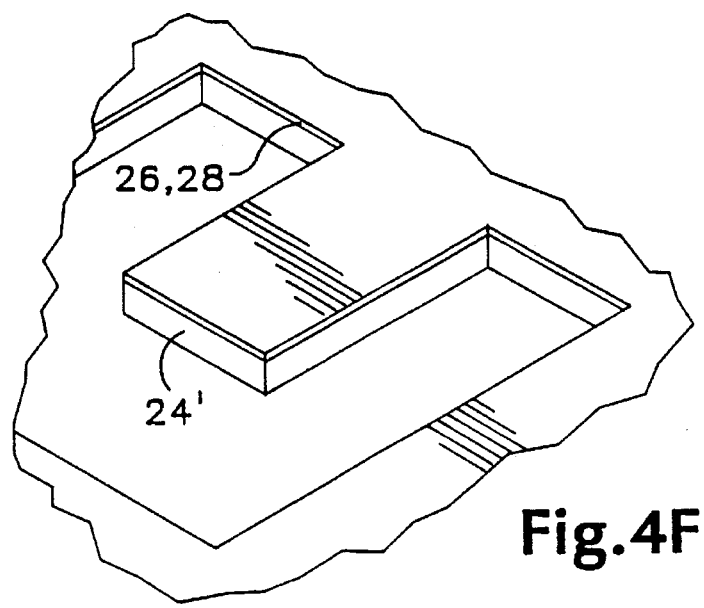
Figure 4G:
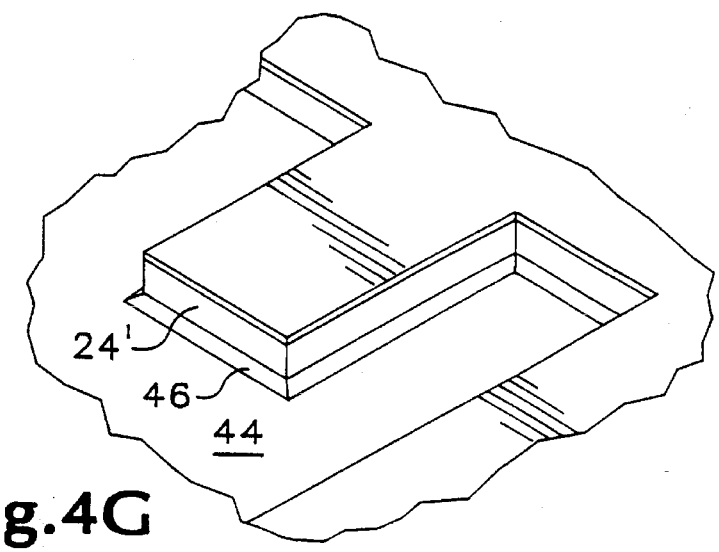

FIG. 4A is a partial sectional view of a monocrystalline <100> silicon die 10 having a front surface 12 and a back surface 14. A layer 16 of silicon nitride is deposited on the back surface 14 to a thickness in the range from about 200 nm to about 1000 nm by a chemical vapor deposition process and a layer 20 of solid state cryogen material, such as gadolinium gallium garnet or gadolinium nickel, is applied to the layer of silicon nitride by thick film deposition techniques. Boron is then implanted into the die by way of its front surface 12 with a dose of 5 E16 $cm^2$ using a voltage of 180 kV, so that a layer 24 containing a high concentration of boron ions is formed in the die subjacent the front surface. The boron ions are driven into the die by heating the die to a temperature of about 1100° C. for about 1.5 hours, and accordingly layer 24 is converted to a deeper layer 24' (FIG. 4B) in which the concentration of boron ions is lower than in layer 24. Nevertheless, the concentration of boron ions in layer 24' is at least 1 E20 $cm^3$. The boron drive takes place under an atmosphere of nitrogen. Layers 26 and 28 of Cr and Au are then deposited sequentially by evaporation on front surface 12 to thicknesses of about 10 nm and 100 nm respectively. A layer of thermally and electrically insulating material, such as silicon nitride or silicon oxide, is deposited over layer 28 and is selectively etched to form a ridge 32 that extends around the periphery of the front surface of the die. An array of standoff bumps 34 is deposited on layer 28 within the area bounded by ridge 32. The standoff bumps are of Au and each about 2 μm in height. A layer 36 of photoresist is deposited on top of layer 28 to a thickness sufficient to cover the standoff bumps and is patterned to define multiple generally rectangular areas 38 (FIG. 4C). The area 38A is shown in FIG. 4C in greater detail than are the areas 38B–38E. Each of the generally rectangular areas 38 has strips 40 extending from one side 42 of the area 38 and each strip 40 has one of the standoff bumps 34 at its end farther from the side 42 of the rectangular area 38. Layer 28 is therefore partially exposed (FIGS. 4C, 4D). The Au that is exposed by partial removal of the layer 36 is then removed by etching, as is the Cr that is exposed by removal of the Au. Accordingly, layer 24' is exposed through apertures in photoresist resist layer 36 and in layers 26, 28. The photoresist that remains is then stripped, and the portion of layer 24' that is exposed through layers 26 and 28 is removed by plasma etching (FIGS. 4E, 4F). The plasma etching does not result in any significant undercutting of layers 26 and 28. Partial removal of layer 24' results in exposure of undoped silicon. The edges of the area of silicon exposed through the apertures in the layers 24', 26, 28 are oriented along the <110> directions. The front surface of the structure shown in FIGS. 4E and 4F is then exposed to an anisotropic etchant, such as KOH at 80° C., which attacks silicon. The rate at which the silicon is removed is greater in the {100} plane than in the {111} planes, and consequently a trough having a flat bottom 44 and sloping sides 46 parallel to the {111} planes is formed beneath the aperture in layer 24'. The anisotropic etchant does not attack layer 24' due to the doping of that layer with boron.

Figure 4H:
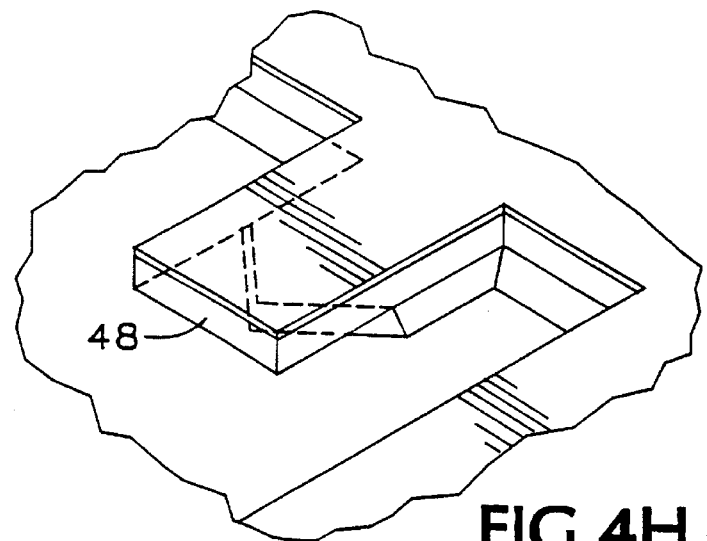
Figure 4I:
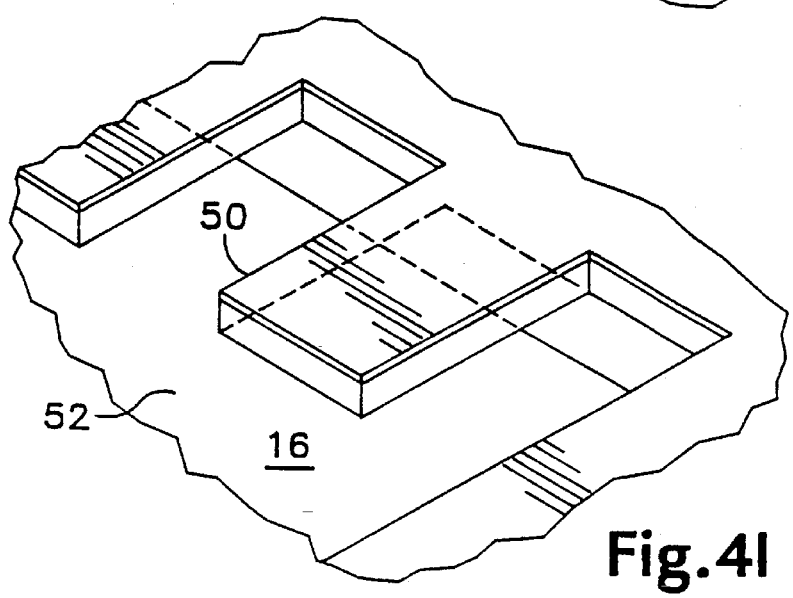

As the trough is formed, {221} planes are exposed at the convex corners of the trough. {221} planes are etched at a rate that is slower than the {100} planes and faster than the {111} planes. Accordingly, the portion 48 of layer 24' is progressively undercut (FIG. 4H). Ultimately, the {221} planes recede to the {111} planes, and eventually portion 48 is fully undercut (FIG. 4I). Accordingly, portion 48 of layer 24' and the portions of layers 26, 28 that overlie portion 48 form a cantilever beam 50 that projects over a well 52.

Etching of the {100} plane continues until the layer 16 of silicon nitride at the back surface of the die is exposed. In this fashion, the die 10 is micromechanically machined to form a well bounded by four sides and having cantilever beams extending from one side of the well towards the opposite side thereof.

Figure 5:
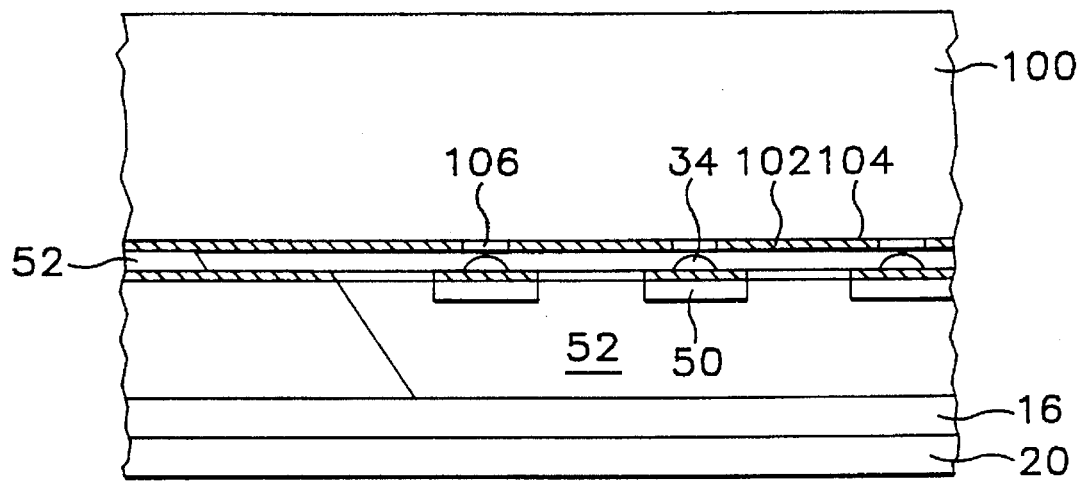
FIG. 5 is a partial sectional view of an integrated circuit assembly including a thermal switch and a cryoelectronic integrated circuit chip.

FIG. 5 shows a cryoelectronic integrated circuit chip 100 that is provided with a metal film 102 on its back surface 104. Parts of the metal film are removed by selective etching using known photolithographic techniques so as to form holes 106 through which areas of the back surface 104 of the chip 100 are exposed in a pattern corresponding to the pattern of standoff bumps at the front surface of the die 10. The size of each hole is about the same as the area covered by one of the standoff bumps. The cryoelectronic chip 100 is then attached to the die 10 so that the exposed areas of the back face of the cryoelectronic chip are in registration With the bumps respectively. However, the ridge 32 of thermally and electrically insulating material hold the back face 104 of chip 100 slightly spaced from the standoff bumps.

When a parallel plate capacitor is charged, the electrostatic force tends to attract the plates together, and this force is dependent on the charge density on the plates of the capacitor. Thus, by establishing a potential difference between the metal film 102 on the back surface of the cryoelectronic integrated circuit chip 100 and the metal layers 26, 28 on the front surface of the die 10, a force is generated that attracts the die 10 toward the cryoelectronic chip. Consequently, the beams are deflected upwards, towards the cryoelectronic integrated circuit chip, as shown in FIG. 5B, and the standoff bumps 34 contact the back surface of the cryoelectronic integrated circuit chip. The thermal conductivity of silicon is quite low at ambient temperature and increases significantly at lower temperatures. However, at higher temperatures, the metal layers 26, 28 on the front surface of the die 10 have good thermal conductivity. Therefore, over quite a wide range of temperatures, a thermally conductive path is established from the cryoelectronic integrated circuit through the standoff bumps, the cantilever beams, the bulk material of the die 10 and the silicon nitride layer 16 to the solid state cryogen 20. By cyclically lowering the entropy of the solid state cryogen and applying a potential difference between the two metal films, heat is conducted intermittently from the cryoelectronic integrated circuit chip to the solid state cryogen and therefore the cryoelectronic chip is cooled. Current does not flow between the film 102 and the layers 26, 28 when the standoff bumps contact the cryoelectronic integrated circuit chip because the holes 106 in the metal film 102 ensure that there is no electrically conductive path.

The standoff bumps are provided in order to limit the amount by which the beams must be deflected in order to contact the back face of the cryoelectronic integrated circuit.

Figure 6A:
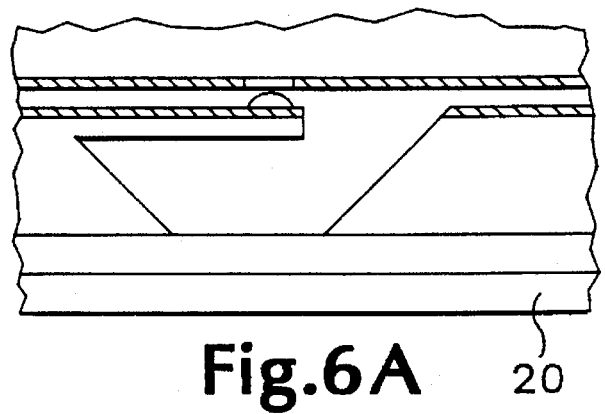
FIGS. 6A and 6B are partial sectional views of the integrated circuit assembly shown in FIG. 5 in different respective operating conditions.
Figure 6B:
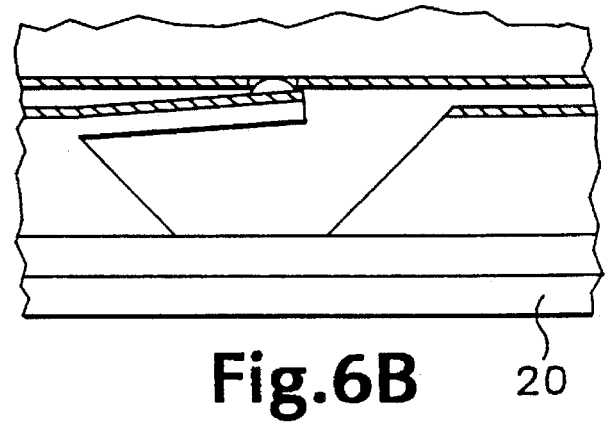

Use of the thermal switch described with reference to FIGS. 4–6 for cooling provides significant advantages over many conventional refrigerators, since it has no parts that are in sliding contact. However, the repeated bending of the cantilever beams stresses the beams and may ultimately lead to failure.

It will be appreciated that the invention is not restricted to the particular embodiment that has been described, and that variations may be made therein without departing from the scope of the invention as defined in the appended claims and equivalents thereof. For example, heat exchangers made by the methods described with reference to FIGS. 1A–1D and thermodynamic members made by the methods described with reference to FIGS. 2A–2C are not restricted in their application to thermodynamic engines that operate on the basis of thermoacoustic effects.

We claim:

1. A thermodynamic engine comprising first and second heat exchange members and a solid state thermodynamic member therebetween, wherein the first heat exchange member comprises a tubular segment, a first array of bars extending parallel to each other across the interior of the tubular segment, and a second array of bars extending parallel to each other and parallel to the first array of bars and is made by investment casting of a thermally conductive metal in a mold made by micromechanical machining.

2. A thermodynamic engine comprising first and second heat exchange members and a solid state thermodynamic member therebetween, wherein the thermodynamic member comprises a support portion defining an opening and a plurality of plates extending parallel to one another across the opening and is made by investment casting of metal in a mold made by micromechanical machining.

3. An integrated circuit structure comprising:

an integrated circuit chip embodying an integrated circuit that is operable at a cryogenic temperature, a cryogen, and a thermal switch for selectively establishing a thermally conductive path between the cryogen and the integrated circuit chip, the thermal switch comprising a body of micromechanically machinable material, said body having a major portion that is in thermally conductive contact with the cryogen and a cantilever beam projecting therefrom and having a distal end spaced from said major portion, and means for selectively deflecting the cantilever beam between a first condition in which its distal end contacts the integrated circuit chip and a second condition in which the distal end is spaced from the integrated circuit chip;

wherein the means for selectively deflecting the cantilever beam comprises a layer of electrically conductive material on the cantilever beam and a layer of electrically conductive material on the integrated circuit chip, whereby application of a potential difference between the two layers of electrically conductive material generates an electrostatic force that deflects the cantilever beam toward said first condition.

4. An integrated circuit structure according to claim 3, wherein at least one of the layers of electrically conductive material is discontinuous, so that when the distal end of the cantilever beam contacts the integrated circuit chip, the layers of electrically conductive material remain insulated from each other.

5. A thermal switch for selectively establishing a thermally conductive path between a cryogen and a body that is to be cooled, comprising:

a body of material formed by micromechanical machining to have a major portion and a cantilever beam projecting therefrom, said major portion being adapted to be placed in thermally conductive contact with the cryogen, and means for selectively deflecting the beam into thermally conductive contact with said body;

wherein the body that is to be cooled has a surface in confronting relationship with a surface of the body of material formed by micromechanical machining, and the means for selectively deflecting the beam comprises a layer of electrically conductive material on said surface of the body that is to be cooled and a layer of electrically conductive material on the body of material formed by micromechanical machining, whereby the application of a potential difference between said layers generates an electrostatic force that deflects the beam toward the body that is to be cooled.

6. A thermal switch according to claim 5, wherein at least one of the layers of electrically conductive material is discontinuous, so that when the cantilever beam contacts the integrated circuit chip, the layers of electrically conductive material remain insulated from each other.

7. A method of fabricating a thermodynamic engine that comprises first and second heat exchange members and a solid state thermodynamic member, the method comprising forming at least one of said members by micromechanical machining, and assembling said members With the solid state thermodynamic member between the first and second heat exchange members, wherein the first heat exchange member comprises a tubular segment, a first array of bars extending parallel to each other across the interior of the tubular segment, and a second array of bars extending parallel to each other and parallel to the first array of bars, and the method comprises using micromechanical machining to form the first heat exchange member.

* * * * *